United States Patent
Aoki (10) Patent No.: US 10,491,102 B2
(45) Date of Patent: Nov. 26, 2019

(54) SEMICONDUCTOR DEVICE, CONTROL METHOD OF SEMICONDUCTOR DEVICE, AND FEEDING SYSTEM

(71) Applicant: Renesas Electronics Corporation, Tokyo (JP)

(72) Inventor: Dan Aoki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 213 days.

(21) Appl. No.: 15/466,753

(22) Filed: Mar. 22, 2017

(65) Prior Publication Data

US 2017/0294832 A1 Oct. 12, 2017

(30) Foreign Application Priority Data

Apr. 6, 2016 (JP) .................................. 2016-076305

(51) Int. Cl.
| | |
|---|---|
| *H02M 1/32* | (2007.01) |
| *H01R 24/64* | (2011.01) |
| *H02H 1/00* | (2006.01) |
| *H01R 107/00* | (2006.01) |
| *H02H 3/08* | (2006.01) |
| *G01R 31/02* | (2006.01) |

(52) U.S. Cl.
CPC .............. *H02M 1/32* (2013.01); *H01R 24/64* (2013.01); *H02H 1/003* (2013.01); *G01R 31/024* (2013.01); *H01R 2107/00* (2013.01); *H02H 3/08* (2013.01)

(58) Field of Classification Search
CPC ........... H02H 1/003; H02H 3/08; H02M 1/32; H01R 24/64; H01R 2107/00; G01R 31/024

USPC .......................................................... 361/18
See application file for complete search history.

(56) References Cited

U.S. PATENT DOCUMENTS

| | | | |
|---|---|---|---|
| 7,159,132 B2 | 1/2007 | Takahashi et al. | |
| 2010/0287399 A1 | 11/2010 | Yasuda | |
| 2012/0098517 A1* | 4/2012 | Esumi | H03K 17/0822 |
| | | | 323/311 |
| 2012/0151231 A1 | 6/2012 | Hatta | |

(Continued)

FOREIGN PATENT DOCUMENTS

| | | |
|---|---|---|
| JP | 2003-263245 A | 9/2003 |
| JP | 2010-263730 A | 11/2010 |

(Continued)

OTHER PUBLICATIONS

Japanese Office Action dated Apr. 16, 2019, in Corresponding Japanese Patent Application No. 2016-076305.

*Primary Examiner* — Kevin J Comber

(74) *Attorney, Agent, or Firm* — McGinn IP Law Group, PLLC (57) ABSTRACT

An object of the present invention is to provide a semiconductor device that can enhance the safety when feeding to a USB device.

Provided is a semiconductor device including: a first power source circuit that generates an output voltage supplied to a USB device coupled to a USB connector; an abnormality detection circuit that determines the state of a supply route of the output voltage generated by the first power source circuit; and a control circuit that controls supply of the output voltage from the first power source circuit to the USB device on the basis of a determination result of the abnormality detection circuit.

12 Claims, 6 Drawing Sheets

(56) References Cited

U.S. PATENT DOCUMENTS

| | | |
|---|---|---|
| 2015/0380183 A1 | 12/2015 | Chiu et al. |
| 2017/0201050 A1* | 7/2017 | Akita ..................... H01B 11/00 |
| 2017/0264204 A1* | 9/2017 | Motoki .................. H02M 1/08 |

FOREIGN PATENT DOCUMENTS

| | | |
|---|---|---|
| JP | 2012-123673 A | 6/2012 |
| JP | 2016-009498 A | 1/2016 |

* cited by examiner

SEMICONDUCTOR DEVICE, CONTROL METHOD OF SEMICONDUCTOR DEVICE, AND FEEDING SYSTEM

CROSS-REFERENCE TO RELATED APPLICATIONS

The disclosure of Japanese Patent Application No. 2016-076305 filed on Apr. 6, 2016 including the specification, drawings and abstract is incorporated herein by reference in its entirety.

BACKGROUND

The disclosure relates to a semiconductor device that supplies a voltage to a USB (Universal Serial Bus) device, a control method of the semiconductor device, and a feeding system.

In recent years, many electronic devices such as personal computers, smartphones, and tablet terminals are equipped with USB (Universal Serial Bus) interfaces. These electronic devices can perform data communications with and can receive electric power supplied from other electronic devices through the USB interfaces.

In this respect, Japanese Unexamined Patent Application Publication No. 2012-123673 shows a configuration in which electric power is supplied to a USB device.

SUMMARY

On the other hand, an output voltage supplied to a USB device of related art was a fixed voltage (5V as an example).

However, since electric power to be required for each device differs, the output voltage on the feeding side needs to be not fixed but variably changed. Thus, it is necessary to enhance the safety when feeding.

For example, in the case where a short-circuit route is generated due to deformation of a USB connector or contamination by foreign substances, there is a possible risk such as fusing by heating or ignition.

The disclosure solves the above-described problems, and an object thereof is to provide a semiconductor device that can enhance the safety when feeding to a USB device, a control method of the semiconductor device, and a feeding system.

The other objects and novel features will become apparent from the description of the specification and the accompanying drawings.

According to an embodiment, a semiconductor device includes: a first power source circuit that generates an output voltage supplied to a USB device coupled to a USB connector; an abnormality detection circuit that determines the state of a supply route of the output voltage generated by the first power source circuit; and a control circuit that controls supply of the output voltage from the first power source circuit to the USB device on the basis of a determination result of the abnormality detection circuit.

According to the embodiment, it is possible to enhance the safety when feeding to a USB device.

DETAILED DESCRIPTION

Embodiments will be described in detail with reference to the drawings. It should be noted that the same or corresponding parts in the drawings are followed by the same signs, and the explanation thereof will not be repeated.

First Embodiment

<A. Configuration>
<a1. Configuration of Feeding System 100>

Figure 1:
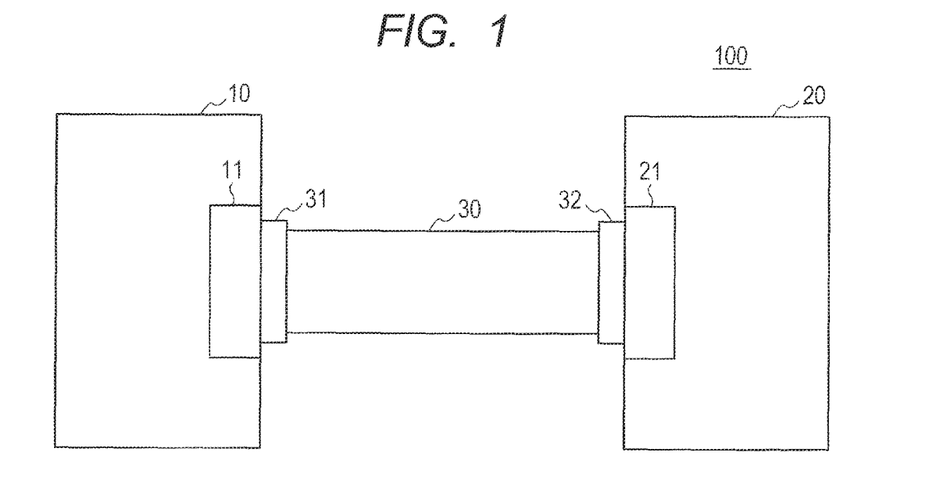
FIG. 1 is a diagram for explaining a configuration of a feeding system 100 on the basis of a first embodiment.

FIG. 1 is a diagram for explaining a configuration of a feeding system 100 on the basis of a first embodiment.

With reference to FIG. 1, the feeding system 100 has a host 10, a USB device 20, and a USB cable 30.

The host 10 includes a connector 11, and the USB device 20 includes a connector 21.

Plugs 31 and 32 are provided at both ends of the USB cable 30. The plug 31 is inserted into the connector 11, and the plug 32 is inserted into the connector 21. Accordingly, the host 10 and the USB device 20 are coupled to each other through the USB cable 30.

The USB device 20 can perform data communications with the host 10 through the USB cable 30, and can receive electric power supplied from the host 10. As an example, a USB Type-C cable can be used for the USB cable 30.

In the example, the host 10 is a source-side device (power source voltage supplying device), and the USB device 20 is a sink-side device (power source voltage receiving device).

<a2. Configuration of USB Cable 30>

Figure 2:
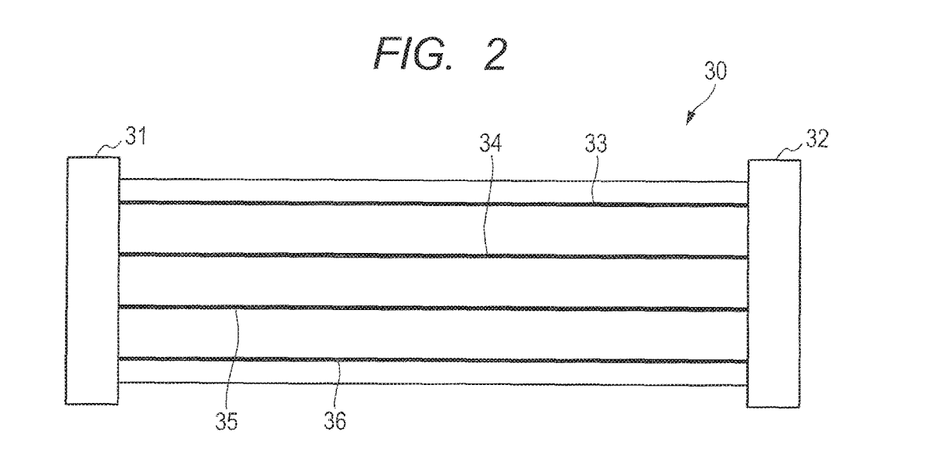
FIG. 2 is a diagram for showing a configuration of a USB cable 30 used in the feeding system 100 on the basis of the first embodiment.

FIG. 2 is a diagram for showing a configuration of the USB cable 30 used in the feeding system 100 on the basis of the first embodiment.

With reference to FIG. 2, the USB cable 30 has a port configuration wiring 33, a power source wiring 34, a data wiring 35, and a grounding wiring 36.

The port configuration wiring 33 includes a configuration channel line CC (hereinafter, referred to as a CC line) that is a one or one-channel side band signal line. The CC line is a set wiring used to perform communications between the source-side device and the sink-side device.

The power source wiring 34 is configured using one or more wirings. The power source wiring 34 includes a power source line VBUS. To the power source line VBUS, supplied is one power source voltage selected among those compliant with power source voltage specifications. Namely, a plurality of power source voltages is selectively supplied to the power source line VBUS.

As an example, a maximum voltage of 20V and a maximum current of 5 A are supplied to the power source line VBUS in accordance with power negotiation between the host 10 and the USB device 20. For example, the host 10 selects one of power source voltages of 5V, 12V, and 20V in accordance with a request from the USB device 20 to be coupled, and supplies the same to the USB device 20 through the power source line VBUS. It should be noted that the host 10 can set voltages by 50 mV between 5 V and 20 V in the specifications.

The data wiring 35 is configured using two or more wirings, and data communications are performed between the host 10 and the USB device 20 through the data wiring 35. As an example, D+/D− for USB 2.0 communications, or TX or RX pair for USB 3.1 communications can be used for the data wiring 35.

The grounding wiring 36 is configured using one or more wirings, and includes a grounding line GND.

<a3. Configuration of Connection Wiring of Feeding System 100>

Figure 3:
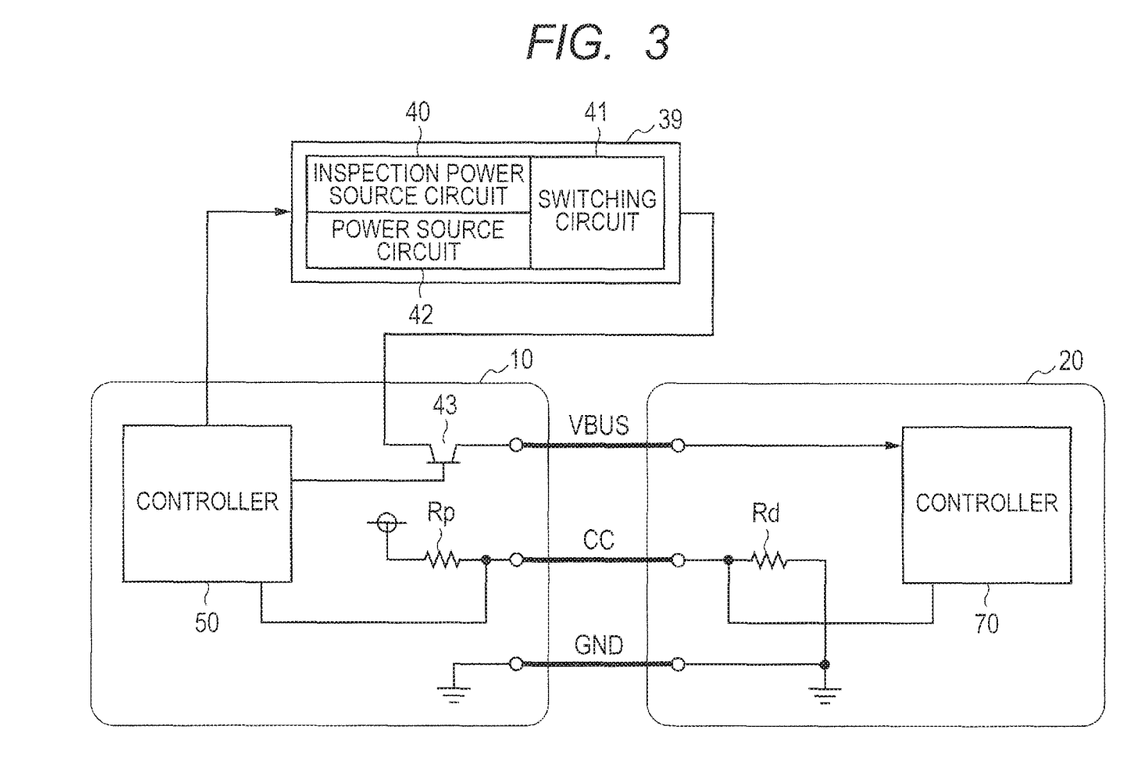
FIG. 3 is a diagram for explaining a configuration of connection wirings of the feeding system 100 on the basis of the first embodiment.

FIG. 3 is a diagram for explaining a configuration of connection wirings of the feeding system 100 on the basis of the first embodiment.

With reference to FIG. 3, the host 10 includes a power source unit 39, a controller 50 for controlling the power source unit 39, a resistor Rp, and a switch 43.

The power source unit 39 includes an inspection power source circuit 40, a switching circuit 41, and a power source circuit 42.

The USB device 20 includes a controller 70 and a resistor Rd.

The host 10 and the USB device 20 are coupled to each other through the CC line, the power source line VBUS, and the grounding line GND. It should be noted that the data wiring is omitted in the drawing.

The controller 70 of the USB device 20 is electrically coupled to the power source line VBUS, and is operated by receiving the power source supplied from the host 10.

The resistor Rd is coupled between the CC line and the grounding voltage. Further, an inner node between the CC line and the resistor Rd is coupled to the controller 70. The controller 70 detects the voltage level of the inner node to detect electric connection with the host 10.

The switch 43 is provided between the power source unit 39 and the power source line VBUS. The switch 43 is controlled by the controller 50. In the case where the switch 43 is in a conductive state in accordance with an instruction from the controller 50, the supply of the power source from the host 10 to the USB device 20 through the power source line VBUS is conducted. In the case where the switch 43 is in a non-conductive state in accordance with an instruction from the controller 50, the supply of the power source from the host 10 to the USB device 20 through the power source line VBUS is shut off.

The controller 50 controls the power source unit 39. Specifically, the controller 50 instructs the inspection power source circuit 40 and the power source circuit 42 to generate voltages.

In accordance with an instruction from the controller 50, the switching circuit 41 switches one of the inspection power source circuit 40 and the power source circuit 42 coupled to the power source line VBUS to another.

In accordance with an instruction from the controller 50, the inspection power source circuit 40 generates a voltage used to determine the state of the voltage supply route of the power source line VBUS.

In accordance with an instruction from the controller 50, the power source circuit 42 generates a voltage necessary for driving the USB device 20. In accordance with an instruction from the controller 50, the power source circuit 42 can variably set a voltage level. As an example, in accordance with an instruction from the controller 50, the power source circuit 42 selects and generates one of the power source voltages of 5V, 12V, and 20V.

The resistor Rp is coupled between the voltage (5V as an example) and the CC line. Further, the inner node between the resistor Rp and the CC line is coupled to the controller 50. The controller 50 detects the voltage level of the inner node to detect electric connection with the USB device 20.

The GND line is coupled to the grounding voltage.

A configuration in which the host 10 and the USB device 20 are coupled to each other through the USB cable 30 will be described.

The resistors Rp and Rd are coupled to each other through the CC line. Accordingly, a current route through the resistors Rp and Rd is formed.

Each of the controllers 50 and 70 detects the voltage level of the CC line between the resistors Rp and Rd on the basis of resistance division of the resistors Rp and Rd.

Each of the controllers 50 and 70 detects a state in which the host 10 and the USB device 20 are coupled to each other by detecting a predetermined voltage on the basis of resistance division of the resistors Rp and Rd.

In the case where the controller 50 detects a state in which the host 10 and the USB device 20 are coupled to each other, the controller 50 executes a process of determining the state of the power source line VBUS that is a voltage supply route. Specifically, the controller 50 instructs the inspection power source circuit 40 to supply an inspection voltage to the power source line VBUS. The inspection voltage is set to be equal to or lower than the voltage generated by the power source circuit 42. Further, the inspection voltage is set to be equal to or lower than the voltage that is normally applied, so that a risk such as fusing by heating can be avoided even when a short-circuit route is generated.

<A4. Configuration of Controller 50 of Feeding System 100>

Figure 4:
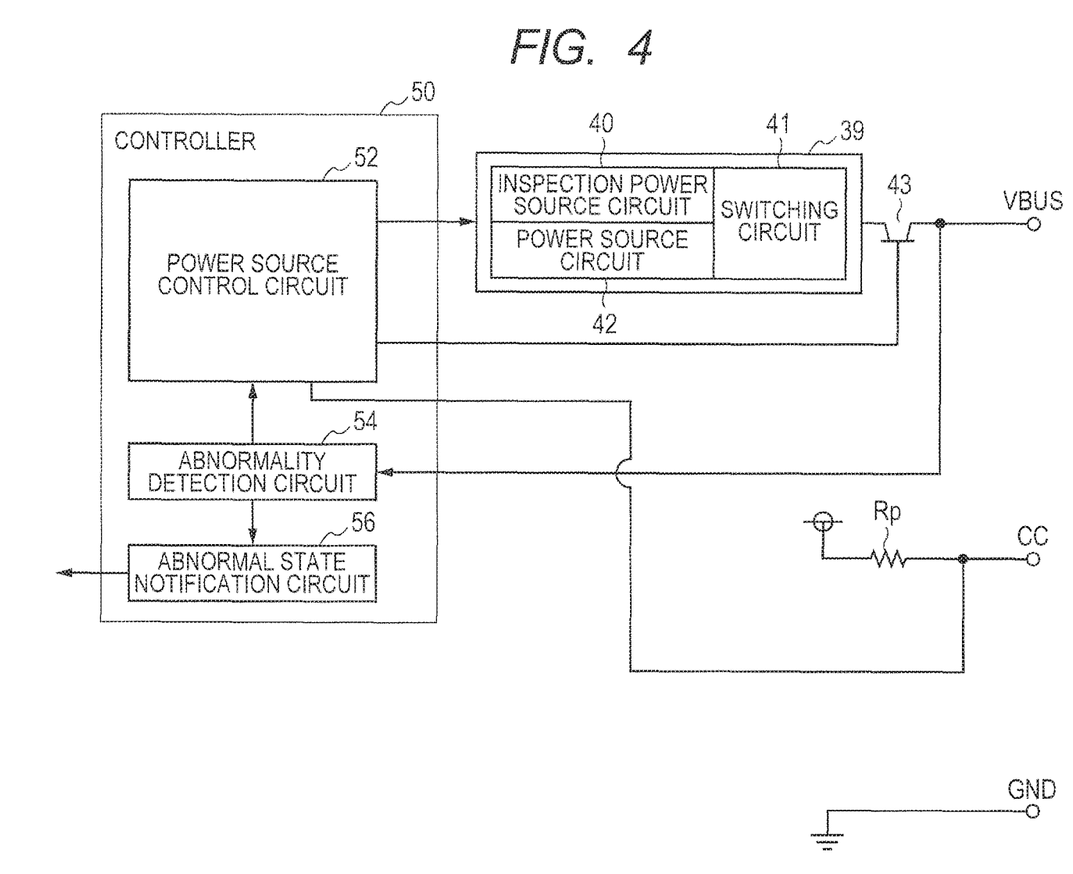
FIG. 4 is a diagram for explaining a functional configuration of a controller 50 on the basis of the first embodiment.

FIG. 4 is a diagram for explaining a functional configuration of the controller 50 on the basis of the first embodiment.

With reference to FIG. 4, the controller 50 includes a power source control circuit 52, an abnormality detection circuit 54, and an abnormal state notification circuit 56.

The power source control circuit 52 controls the power source unit 39 and the switch 43.

The power source control circuit 52 instructs the inspection power source circuit 40 and the power source circuit 42 to generate voltages, and instructs the switching circuit 41 to switch one of the inspection power source circuit 40 and the power source circuit 42 coupled to the power source line VBUS to another. It should be noted that it is assumed that the inspection power source circuit 40 is coupled to the power source line VBUS through the switch 43 in the initial state. Further, the power source control circuit 52 controls conduction/non-conduction of the switch 43.

The abnormality detection circuit 54 determines whether the state of the voltage supply route is normal or abnormal. The abnormality detection circuit 54 outputs the determination result to the power source control circuit 52. Further, the abnormality detection circuit 54 outputs the determination result to the abnormal state notification circuit 56.

The abnormal state notification circuit 56 notifies an abnormal state on the basis of the determination result of the abnormality detection circuit 54. Specifically, the abnormal state notification circuit 56 informs the outside of an abnormal state using an alarm sound or an LED. The abnormal state notification circuit 56 may display an abnormal state using a display device (not shown) other than an alarm sound or an LED. Alternatively, the abnormal state notification circuit 56 may inform the outside of an abnormal state using a communication circuit.

<B. Flow>

Figure 5:
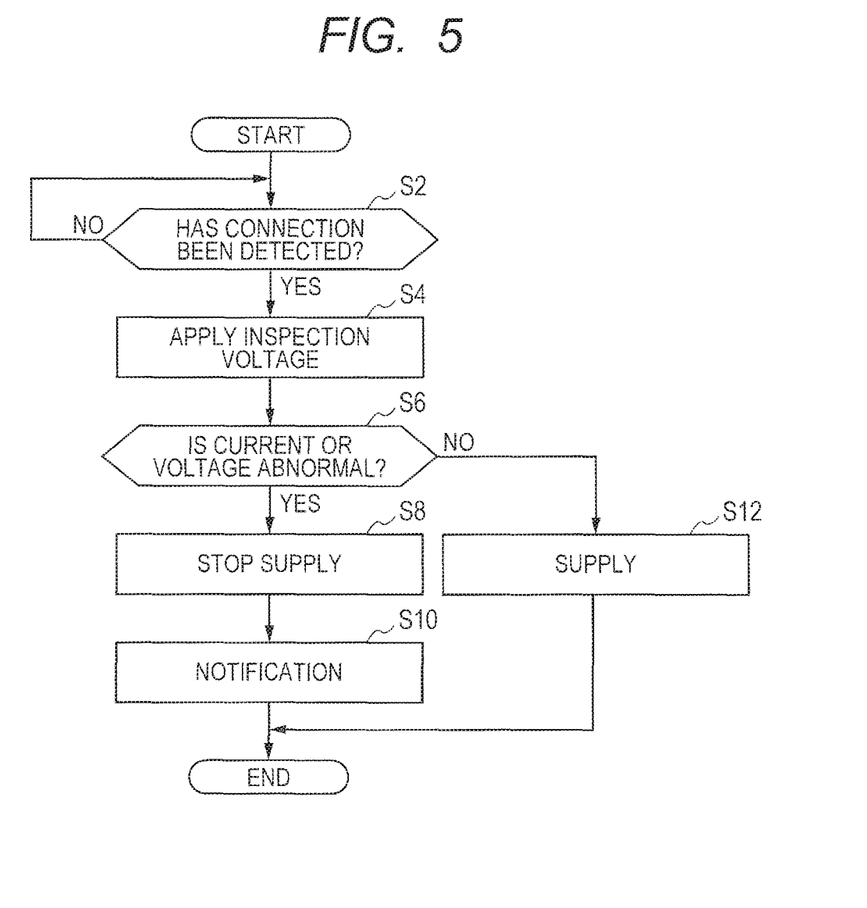
FIG. 5 is a flowchart for explaining control by a host 10 on the basis of the first embodiment.

FIG. 5 is a flowchart for explaining control by the host 10 on the basis of the first embodiment.

With reference to FIG. 5, the host 10 determines whether or not the connection with the USB device has been detected (Step S2). Specifically, the power source control circuit 52 determines whether or not the voltage of the inner node is at a predetermined voltage level.

Next, in the case where the host 10 determines that the connection has been detected (YES in Step S2), the inspection voltage is applied (Step S4). In the case where the power source control circuit 52 determines that the voltage of the inner node is at a predetermined voltage level, it is determined that the connection with the USB device 20 has been detected. In the case where the connection with the USB device 20 has been detected, the power source control circuit 52 instructs the inspection power source circuit 40 to generate the inspection voltage. Then, the power source control circuit 52 instructs the switch 43 to be set in a conductive state. Accordingly, the inspection voltage generated by the inspection power source circuit 40 is applied to the power source line VBUS. It should be noted that the power source circuit 42 does not supply the power source.

Next, the host 10 determines whether or not the current or voltage is abnormal (Step S6). The abnormality detection circuit 54 determines whether or not the current flowing in or the voltage supplied to the power source line VBUS is abnormal.

For example, in the case where the voltage level drops or a current the level of which is equal to or higher than a predetermined level flows, it can be determined that an abnormality occurs in the power source line VBUS (for example, a short-circuit state). The abnormality detection circuit 54 notifies the power source control circuit 52 of the abnormal state. Further, the abnormality detection circuit 54 notifies the abnormal state notification circuit 56 of the abnormal state.

In the case where the host 10 determines that the current or voltage is abnormal in Step S6 (YES in Step S6), the supply of the power source is stopped (Step S8). The power source control circuit 52 instructs the switch 43 to be set in a non-conductive state. Accordingly, the supply of the voltage to the power source line VBUS is shut off.

Then, the host 10 notifies the abnormal state (Step S10). The abnormal state notification circuit 56 informs the abnormal state.

Then, the process is completed (end).

On the other hand, in the case where the host 10 determines that the current or voltage is not abnormal in Step S6 (NO in Step S6), the power source is supplied (Step S12). The power source control circuit 52 instructs the power source circuit 42. The power source circuit 42 generates the power source in accordance with the instruction. Further, the power source control circuit 52 instructs the switching circuit 41 to switch so that the power source circuit 42 and the switch 43 are electrically coupled to each other. Accordingly, the voltage generated by the power source circuit 42 is supplied to the power source line VBUS.

Then, the process is completed (end).

In accordance with the method on the basis of the first embodiment, the state of the voltage supply route can be determined by applying the inspection voltage before supplying the voltage from the power source circuit 42. In the case where it is determined that the state of the supply route is abnormal, the abnormal state is informed. On the other hand, in the case where it is determined that the state of the supply route is not abnormal, the normal voltage is supplied to the supply route.

Therefore, in the case where it is determined that the feeding to the USB device is safe after inspecting the safety of the supply route, the voltage is supplied. Thus, the safety of the feeding can be enhanced.

Modified Example

In the above-described first embodiment, the configuration in which the inspection power source circuit 40 and the power source circuit 42 are independently provided in the power source unit 39 has been described. However, the power source circuit 42 can be configured to generate the inspection voltage in accordance with an instruction from the controller 50. In this case, a simple configuration can be realized because it is not necessary to provide the inspection power source circuit 40 and the switching circuit 41.

Second Embodiment

In the above-described first embodiment, the method of determining whether or not the power source line VBUS included in the cable 30 is abnormal has been described. On the other hand, it may be determined whether or not components other than the power source line VBUS are abnormal.

<a5. Configuration of USB Cable 30A>

Figure 6:
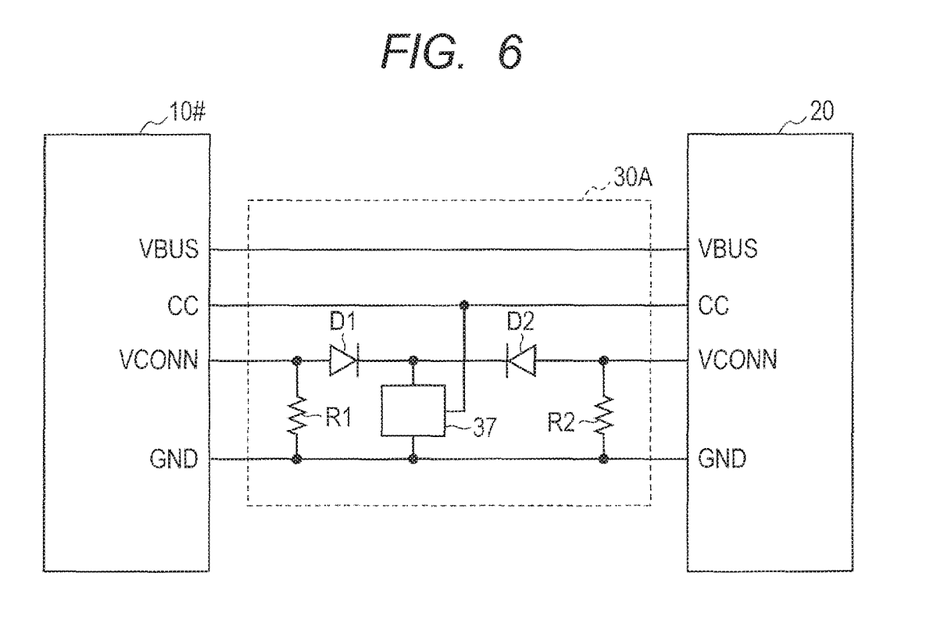
FIG. 6 is a diagram for showing an example of a configuration of a USB cable 30A used in a feeding system 100 on the basis of a second embodiment.

FIG. 6 is a diagram for showing an example of a configuration of a USB cable 30A used in a feeding system 100 on the basis of a second embodiment.

With reference to FIG. 6, the USB cable 30A is provided between a host 10# and a USB device 20.

The USB cable 30A includes a power source line VBUS, a CC line, a power source line VCONN, and a grounding line GND.

The USB cable 30A includes diodes D1 and D2 for backflow prevention, resistors R1 and R2, and an ID chip 37.

The power source line VCONN is a power source line through which the power source is supplied to a device provided in the USB cable 30A.

The example shows a case in which the ID chip 37 is provided in the USB cable 30A. Cable specification information such as the current capacity and performance that can be supported by the cable and vendor recognition information is stored in the ID chip 37. The ID chip 37 is coupled to the power source line VCONN and the grounding line GND of the USB cable 30A.

As the USB cable 30A, an electronically marked cable with cable specification information is used.

The diodes D1 and D2 for backflow prevention are provided in the power source line VCONN. The anode of the diode D1 is coupled to the host 10# side. In addition, the cathode thereof is coupled to the ID chip 37. The anode of the diode D2 is coupled to the USB device 20 side. In addition, the cathode thereof is coupled to the ID chip 37.

A node between the host 10# and the anode of the diode D1 of the power source line VCONN is coupled to the grounding line GND through the resistor R1.

A node between the USB device 20 and the anode of the diode D2 of the power source line VCONN is coupled to the grounding line GND through the resistor R2.

Further, the ID chip 37 is coupled to the CC line. The ID chip 37 is a notification unit to notify the host 10# of the current capacity of the USB cable 30A. The cable specification information stored in the ID chip 37 is transmitted to the host 10# through the CC line as a vendor defined message together with an SOP' (Start of Packet Sequence Prime) packet indicating the start of a sequence.

The SOP' packet is recognized by the host 10#. The characteristics of the USB cable 30A are notified to the host 10# as the vendor defined message. The host 10# supplies necessary electric power to the USB device 20 while referring to the current capacity that can be supported by the USB cable 30A in accordance with the cable specification information.

<a6. Configuration of Connection Wiring of Feeding System 100>

Figure 7:
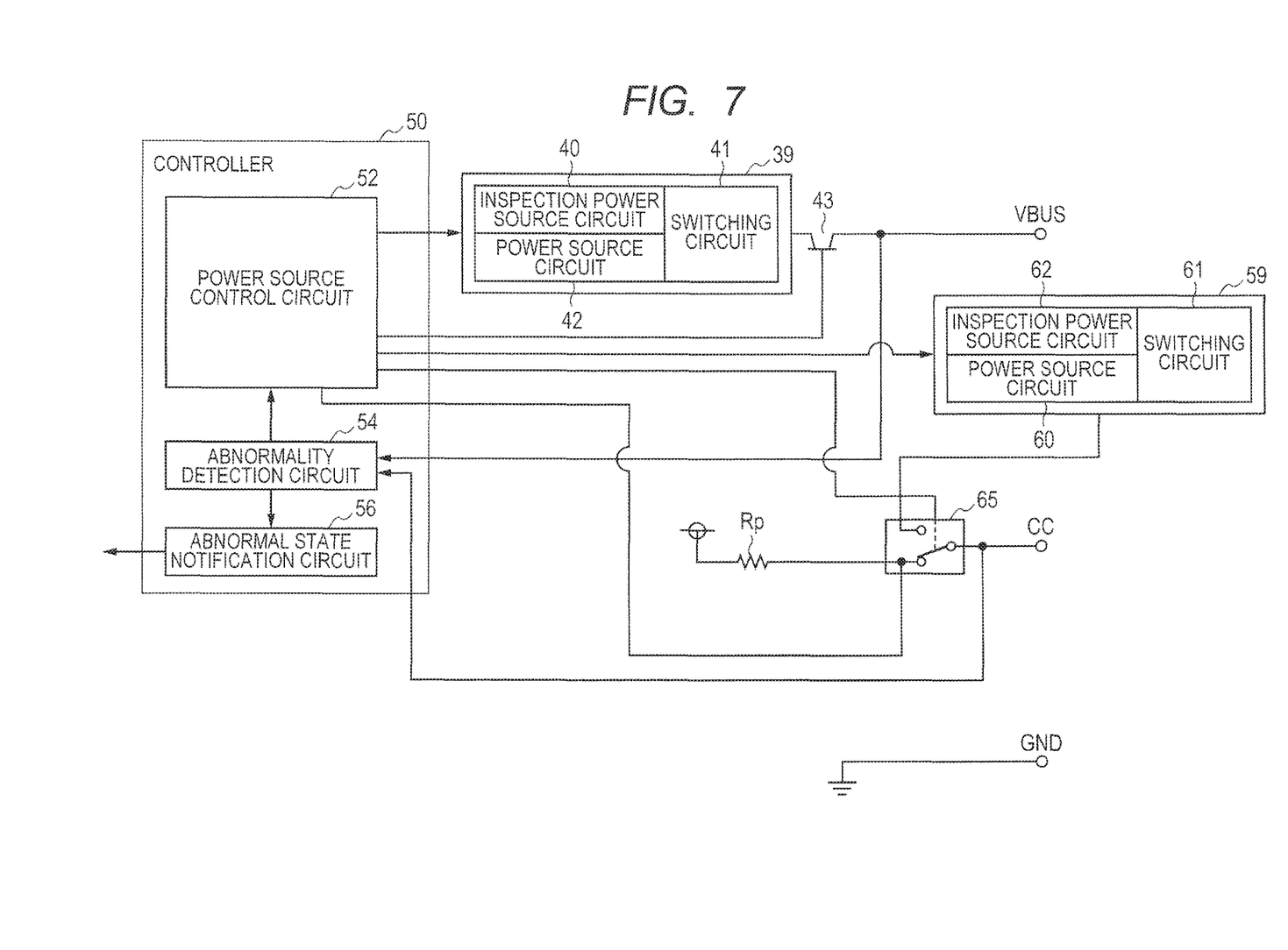
FIG. 7 is a diagram for explaining a configuration of connection wirings of the feeding system 100 on the basis of the second embodiment.

FIG. 7 is a diagram for explaining a configuration of connection wirings of the feeding system 100 on the basis of the second embodiment.

With reference to FIG. 7, the host 10# further includes a power source unit 59 and a switch 65 as compared to the host 10. The power source unit 59 includes an inspection power source circuit 62, a power source circuit 60, and a switching circuit 61.

In accordance with an instruction from the controller 50, the power source circuit 60 generates a voltage necessary for driving the ID chip 37.

In accordance with an instruction from the controller 50, the inspection power source circuit 62 generates a voltage used to determine the state of the voltage supply route of the power source line VCONN.

In accordance with an instruction from the controller 50, the switching circuit 61 switches one of the inspection power source circuit 62 and the power source circuit 60 coupled to the switch 65 to another.

The switch 65 switches one of the resistor Rp and the power source unit 59 coupled to the CC line to another.

The switch 65 allows the resistor Rp and the CC line to be electrically coupled to each other in the initial state. Accordingly, the connection with the USB device 20 is detected. A method of detecting the connection is the same as that described in the first embodiment, and thus the detailed explanation thereof will not be repeated. After detecting the connection with the USB device 20, the switch 65 switches so that the power source unit 59 and the CC line are electrically coupled to each other.

The control of the host 10# on the basis of the second embodiment is the same as that in the first embodiment.

Specifically, the host 10# determines whether or not the connection with the USB device 20 has been detected (Step S2). The power source control circuit 52 determines whether or not the voltage of the inner node is at a predetermined voltage level.

Next, in the case where the host 10# determines that the connection with the USB device 20 has been detected (YES in Step S2), the inspection voltage is applied (Step S4). In the case where the power source control circuit 52 determines that the voltage of the inner node is at a predetermined voltage level, it is determined that the connection with the USB device 20 has been detected. In the case where the connection with the USB device 20 has been detected, the power source control circuit 52 instructs the inspection power source circuit 40. Then, the power source control circuit 52 instructs the switch 43 to be set in a conductive state. Accordingly, the inspection voltage generated by the inspection power source circuit 40 is applied to the power source line VBUS.

Further, in the case where the connection with the USB device 20 has been detected, the power source control circuit 52 instructs the inspection power source circuit 62. Then, the power source control circuit 52 instructs the switch 65 to electrically couple the power source unit 59 and the CC line to each other. Accordingly, the inspection voltage is applied from the inspection power source circuit 62 to the CC line.

Next, the host 10# determines whether or not the current or voltage is abnormal (Step S6). The abnormality detection circuit 54 determines whether or not the current flowing in or the voltage supplied to the power source line VBUS is abnormal. Further, the abnormality detection circuit 54 determines whether or not the current flowing in or the voltage supplied to the power source line VONN is abnormal.

For example, in the case where the voltage level drops or a current the level of which is equal to or higher than a predetermined level flows, it can be determined that an abnormality occurs in the power source line VBUS or the power source line VONN (for example, a short-circuit state). The abnormality detection circuit 54 notifies the power source control circuit 52 of the abnormal state. Further, the abnormality detection circuit 54 notifies the abnormal state notification circuit 56 of the abnormal state.

In the case where the host 10# determines that the current or voltage is abnormal in Step S6 (YES in Step S6), the supply of the power source is stopped (Step S8). The power source control circuit 52 instructs the switch 43 to be set in a non-conductive state. The power source control circuit 52 instructs the power source unit 59 to stop the supply of the power source from the power source circuit 60 or the inspection power source circuit 62.

Then, the host 10# notifies the abnormal state (Step S10). The abnormal state notification circuit 56 informs the abnormal state.

Then, the process is completed (end).

On the other hand, in the case where the host 10# determines that the current or voltage is not abnormal in Step S6 (NO in Step S6), the power source is supplied (Step S12). The power source control circuit 52 instructs the power source circuit 42. The power source circuit 42 generates the power source in accordance with the instruction. Further, the power source control circuit 52 instructs the switching circuit 41 to switch so that the power source circuit 42 and the switch 43 are electrically coupled to each other. Accordingly, the voltage generated by the power source circuit 42 is supplied to the power source line VBUS. Further, the power source control circuit 52 instructs the power source circuit 60. The power source circuit 60 generates the power source in accordance with the instruction. Accordingly, the voltage generated by the power source circuit 60 is supplied to the power source line VONN.

Then, the process is completed (end).

In accordance with the method on the basis of the second embodiment, the state of the power source line VBUS that is a voltage supply route can be determined by applying the inspection voltage before supplying the voltage from the power source circuit 42. Further, the state of the power source line VONN that is a voltage supply route can be determined by applying the inspection voltage before supplying the voltage from the power source circuit 60. In the case where it is determined that the state of the supply route is abnormal, the abnormal state is informed. On the other hand, in the case where it is determined that the state of the supply route is not abnormal, the normal voltage is supplied to the supply route.

Therefore, in the case where it is determined that the feeding to the USB device is safe after inspecting the safety of the supply route, the voltage is supplied. Thus, the safety of the feeding can be enhanced.

It should be noted that the configuration in which one ID chip is provided in the USB cable has been described in the above-described second embodiment. However, the present invention can be similarly applied to a different USB cable including a plurality of ID chips.

Another Embodiment

In the above description, the USB device 20 is configured to receive the power source voltage supplied from the host 10. However, the USB device 20 can be configured in such a manner that the USB device 20 receives the voltage from the host 10 and supplies the power source voltage to another device.

The disclosure has been described above in detail on the basis of the embodiments. However, it is obvious that the disclosure is not limited to the embodiments, but can be variously changed without departing from the scope thereof.

What is claimed is:

1. A semiconductor device comprising:
    a first power source circuit that generates an output voltage supplied and supplies the output voltage through a power source line to a USB (Universal Serial Bus) device coupled to a USB connector;
    an abnormality detection circuit that determines the state of the power source line, which is a supply route of the output voltage generated by the first power source circuit, and
    a control circuit that controls supply and generation of the output voltage from the first power source circuit to the USB device on the basis of a determination result of the abnormality detection circuit.

2. The semiconductor device according to claim 1, wherein in the case where an abnormality is detected as the determination result of the abnormality detection circuit, the control circuit stops the supply of the output voltage from the first power source circuit to the USB device.

3. The semiconductor device according to claim 1, wherein in the case where a test voltage is applied, the abnormality detection circuit determines the state of the supply route on the basis of the state of a current or voltage flowing in the supply route.

4. The semiconductor device according to claim 3, wherein the test voltage is set to be equal to or lower than the output voltage supplied to the USB device in a regular condition.

5. The semiconductor device according to claim 3, wherein the first power source circuit generates the test voltage in accordance with an instruction.

6. The semiconductor device according to claim 1, wherein a notification circuit that notifies an abnormality when the abnormality is detected as the determination result of the abnormality detection circuit is further provided.

7. The semiconductor device according to claim 1, wherein the first power source circuit can variably set the voltage level of the output voltage in accordance with an instruction from the control circuit.

8. The semiconductor device according to claim 1,
    wherein the first power source circuit is coupled to the USB device through a cable,
    wherein a second power source circuit for supplying a voltage to a device provided in the cable is further provided, and
    wherein the abnormality detection circuit further determines the state of the supply route of the voltage supplied from the second power source circuit.

9. The semiconductor device according to claim 1,
    wherein a power source wiring includes the power source line VBUS,
    wherein the first power source circuit generates the output voltage and supplies the output voltage through the power source line VBUS to the USB device coupled to the USB connector, and
    wherein the abnormality detection circuit determines the state of the power source line VBUS, which is the supply route of the output voltage generated by the first power source circuit.

10. The semiconductor device according to claim 1, wherein the abnormality detection circuit determines the state of the power line by determining whether or not a current flowing in or a voltage supplied to the power source line is abnormal or not, and outputs the determination result to the control circuit to control the supply of the output voltage.

11. A control method of a semiconductor device comprising:
    generating an output voltage and supplying the output voltage through a power source line to a USB (Universal Serial Bus) device coupled to a USB connector;
    determining the state of the power source line, which is a supply route of the generated output voltage, and
    controlling supply and generation of the output voltage from a first power source circuit supplied to the USB device on the basis of a determination result of the determining of the state of the power source line.

12. A feeding system comprising:
    a USB (Universal Serial Bus) connector;
    a first power source circuit that generates an output voltage and supplies the output voltage through a power source line to a USB device coupled to the USB connector;
    an abnormality detection circuit that determines the state of the power source line, which is a supply route of the output voltage generated by the first power source circuit, and
    a control circuit that controls supply and generation of the output voltage from the first power source circuit to the USB device on the basis of a determination result of the abnormality detection circuit.

* * * * *